(12) United States Patent
Kazama et al.

(10) Patent No.: US 7,896,480 B2
(45) Date of Patent: Mar. 1, 2011

(54) LIQUID JET HEAD AND A PIEZOELECTRIC ELEMENT

(75) Inventors: Hironobu Kazama, Matsumoto (JP); Yuka Yonekura, Chino (JP); Koji Sumi, Shiojiri (JP)

(73) Assignee: Seiko Epson Corporation, Tokyo (JP)

( * ) Notice: Subject to any disclaimer, the term of this patent is extended or adjusted under 35 U.S.C. 154(b) by 138 days.

(21) Appl. No.: 12/433,204

(22) Filed: Apr. 30, 2009

(65) Prior Publication Data

US 2009/0273652 A1 Nov. 5, 2009

(30) Foreign Application Priority Data

Apr. 30, 2008 (JP) .............................. 2008-118899
Apr. 30, 2009 (JP) .............................. 2009-110583

(51) Int. Cl.
*B41J 2/045* (2006.01)
(52) U.S. Cl. ...................................................... 347/68
(58) Field of Classification Search .................. 347/68, 347/69–72; 400/124.14, 124.16; 310/311, 310/324, 327, 358, 365; 204/192.18; 430/319; 427/100

See application file for complete search history.

(56) References Cited

U.S. PATENT DOCUMENTS 6,103,072 A * 8/2000 Nishiwaki et al. ...... 204/192.18
6,284,434 B1 * 9/2001 Kamei et al. ................. 430/319
2006/0146097 A1 * 7/2006 Fujii et al. ..................... 347/68

FOREIGN PATENT DOCUMENTS

JP 2006-278835 10/2006

* cited by examiner

*Primary Examiner*—K. Feggins
(74) *Attorney, Agent, or Firm*—Workman Nydegger

(57) ABSTRACT

A liquid jet head includes a passage-forming substrate composed of a crystal substrate provided with pressure-generating chambers communicating with nozzle orifices and piezoelectric elements disposed on the passage-forming substrate and each composed of a lower electrode, a piezoelectric material layer, and an upper electrode to cause a change of pressure in the pressure-generating chamber. The piezoelectric material layer has a thickness of 5 µm or less and is made of a perovskite-type crystal and is configured such that the distance between an X-ray diffraction peak position derived from the (220) plane of the passage-forming substrate and an X-ray diffraction peak position derived from the (110) plane of the piezoelectric material layer is within a range of $2\theta=16.262\pm0.1$ degrees.

4 Claims, 3 Drawing Sheets

LIQUID JET HEAD AND A PIEZOELECTRIC ELEMENT

BACKGROUND OF THE INVENTION

1. Field of the Invention

The present invention relates to a liquid jet head including piezoelectric elements each composed of a lower electrode, a piezoelectric material layer, and an upper electrode and relates to the piezoelectric element.

2. Description of the Related Art

A piezoelectric element that is used in, for example, a liquid jet head is an element in which a piezoelectric material film made of a piezoelectric material having an electromechanical transduction function is disposed between two electrodes. The piezoelectric material film is configured of, for example, crystallized piezoelectric ceramic.

An example of the liquid jet head including such piezoelectric elements is an ink jet recording head structured in a manner such that part of a pressure-generating chamber communicating with a nozzle orifice for ejecting ink droplets is constituted of a vibrating plate and the piezoelectric element deforms the vibrating plate so as to apply a pressure to ink in the pressure-generating chamber, so that ink droplets are ejected from the nozzle orifice. There are two types of ink jet recording heads in practical use: one employs a longitudinal vibration-mode actuator in which a piezoelectric element expands and contracts in an axial direction, and the other employs a flexural vibration-mode actuator. In order to arrange these actuators at a high density, piezoelectric elements that can obtain a large magnitude of strain by a small deriving voltage, i.e., piezoelectric elements that give a large magnitude of displacement are required.

Furthermore, Japanese Unexamined Patent Application, Publication No. 2006-278835 discloses a piezoelectric material layer of which X-ray diffraction peak position is regulated for improving the displacement characteristics of the piezoelectric material layer.

However, satisfactory piezoelectric characteristics could not be obtained even if piezoelectric elements with such a high dielectric film were employed. In addition, this problem is not limited to liquid jet heads represented by ink jet recording heads and is similarly present in other actuator devices.

SUMMARY OF THE INVENTION

Accordingly, the invention has been made to at least partially solve the above-described problem and can be realized as the following modes and application examples.

The liquid jet head includes a passage-forming substrate composed of a crystal substrate provided with pressure-generating chambers communicating with nozzle orifices and piezoelectric elements disposed on the passage-forming substrate and each composed of a lower electrode, a piezoelectric material layer, and an upper electrode to cause a change of pressure in the pressure-generating chamber. The piezoelectric material layer has a thickness of 5 μm or less and is made of a perovskite-type crystal and is configured such that the distance between an X-ray diffraction peak position derived from the (220) plane of the passage-forming substrate and an X-ray diffraction peak position derived from the (110) plane of the piezoelectric material layer is within a range of $2\theta=16.262\pm0.1$ degrees.

Other characteristics and objects of the invention will become more apparent by reading the specification with reference to the accompanying drawings.

BRIEF DESCRIPTION OF THE DRAWINGS

It is recommended to refer to both the following description and the accompanying drawings for more completely comprehending the invention and advantages thereof.

DETAILED DESCRIPTION OF THE PREFERRED EMBODIMENTS

Figure 1:
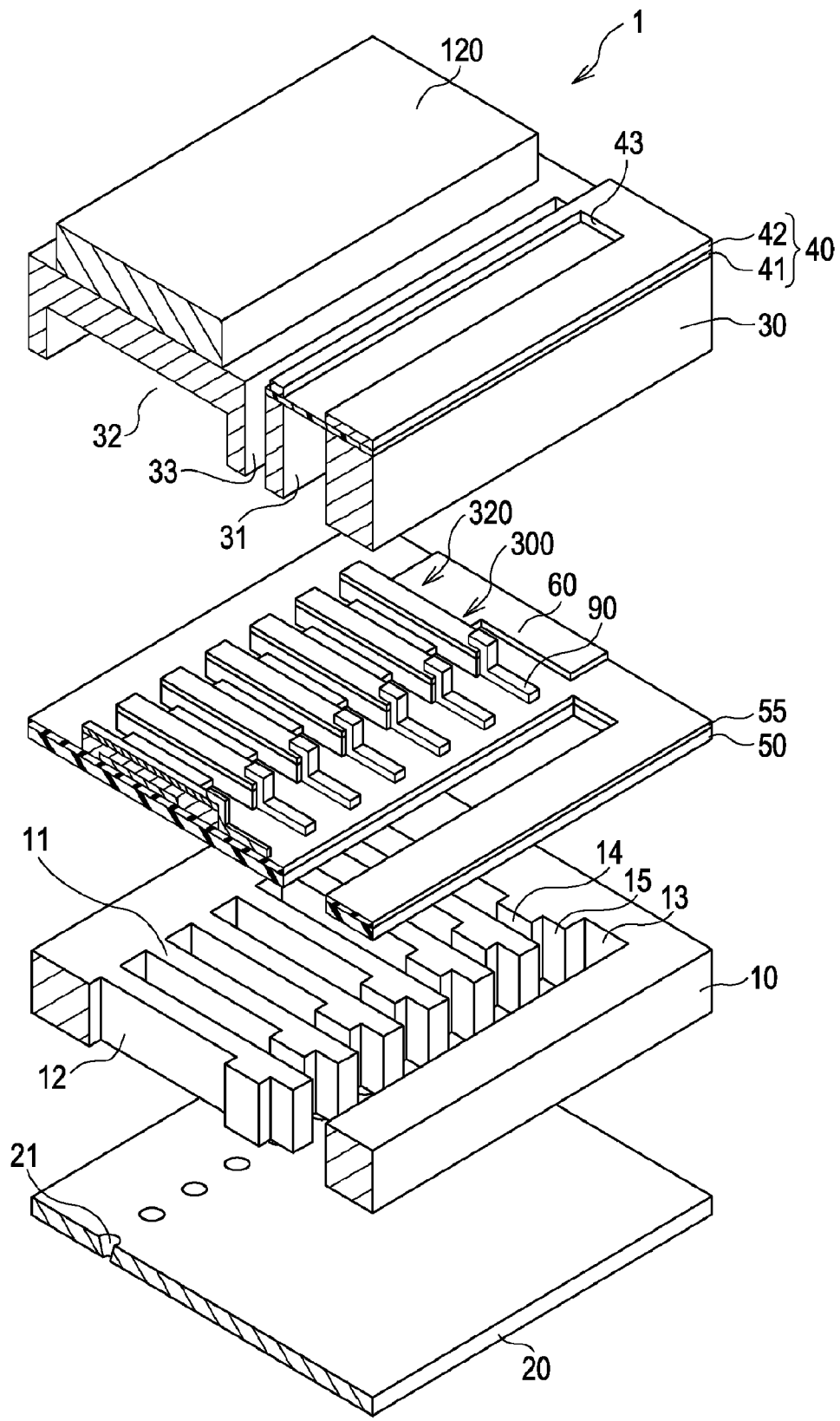
FIG. 1 is an exploded perspective view of a recording head according to Embodiment 1 of the invention.

The description and the accompanying drawings will make at least the followings obvious.

The liquid jet head includes a passage-forming substrate made of a crystal substrate provided with pressure-generating chambers communicating with nozzle orifices and piezoelectric elements disposed on the passage-forming substrate and each including a lower electrode, a piezoelectric material layer, and an upper electrode to cause a change of pressure in the pressure-generating chamber. The piezoelectric material layer has a thickness of 5 μm or less and is made of a perovskite-type crystal. Furthermore, the piezoelectric material layer is configured such that the distance between an X-ray diffraction peak position derived from the (220) plane of the passage-forming substrate and an X-ray diffraction peak position derived from the (110) plane of the piezoelectric material layer is within a range of $2\theta=16.262\pm0.1$ degrees.

In the embodiment, the piezoelectric material layer has predetermined crystallinity, and thereby a large magnitude of displacement can be obtained by a low driving voltage, and piezoelectric characteristics, such as durability of the piezoelectric material layer, delamination, and partial fixation of the polarization direction with time by repeating rotation and extension/retraction of polarization during the drive, that is, a decrease in the magnitude of displacement due to the so-called fatigue phenomenon, can be improved. Consequently, a liquid jet head excellent in liquid jet characteristics can be realized.

Here, the half-value width of the X-ray diffraction peak derived from the (110) plane of the piezoelectric material layer is preferably 0.3 degrees or less. By doing so, the variation in composition ratio in the thickness direction of the piezoelectric material layer, i.e., the variation in the crystal lattice is reduced to provide excellent piezoelectric characteristics.

In addition, preferably, the lower electrode is made of a material whose main component is platinum, and the distance between an X-ray diffraction peak position derived from the (111) plane of the lower electrode and the X-ray diffraction peak position derived from the (220) plane of the passage-forming substrate is within a range of $2\theta=7.411\pm0.1$ degrees. By doing so, the stress of the lower electrode is regulated within a predetermined range, which allows the piezoelectric material layer formed on the lower electrode to have crystallinity excellent in piezoelectric characteristics.

The piezoelectric element includes a lower electrode, a piezoelectric material layer having a thickness of 5 μm or less and being made of a perovskite-type crystal, and an upper electrode, on a crystal substrate. The piezoelectric material layer is configured such that the distance between the X-ray diffraction peak position derived from the (220) plane of the crystal substrate and the X-ray diffraction peak position derived from the (110) plane of the piezoelectric material layer is within a range of 2θ=16.262±0.1 degrees.

In the embodiment, for example, piezoelectric characteristics, such as durability of the piezoelectric material layer, delamination, and partial fixation of the polarization direction with time by repeating rotation and extension/retraction of polarization during the drive, that is, a decrease in the magnitude of displacement due to the so-called fatigue phenomenon, can be improved.

A preferred embodiment of the invention will now be described with reference to the drawings. However, the embodiment described below is only given as an example, and not all the structures to be described are indispensable components of the invention.

PREFERRED EMBODIMENT

An embodiment will be described with reference to the drawings below.

Embodiment 1

Figure 2:
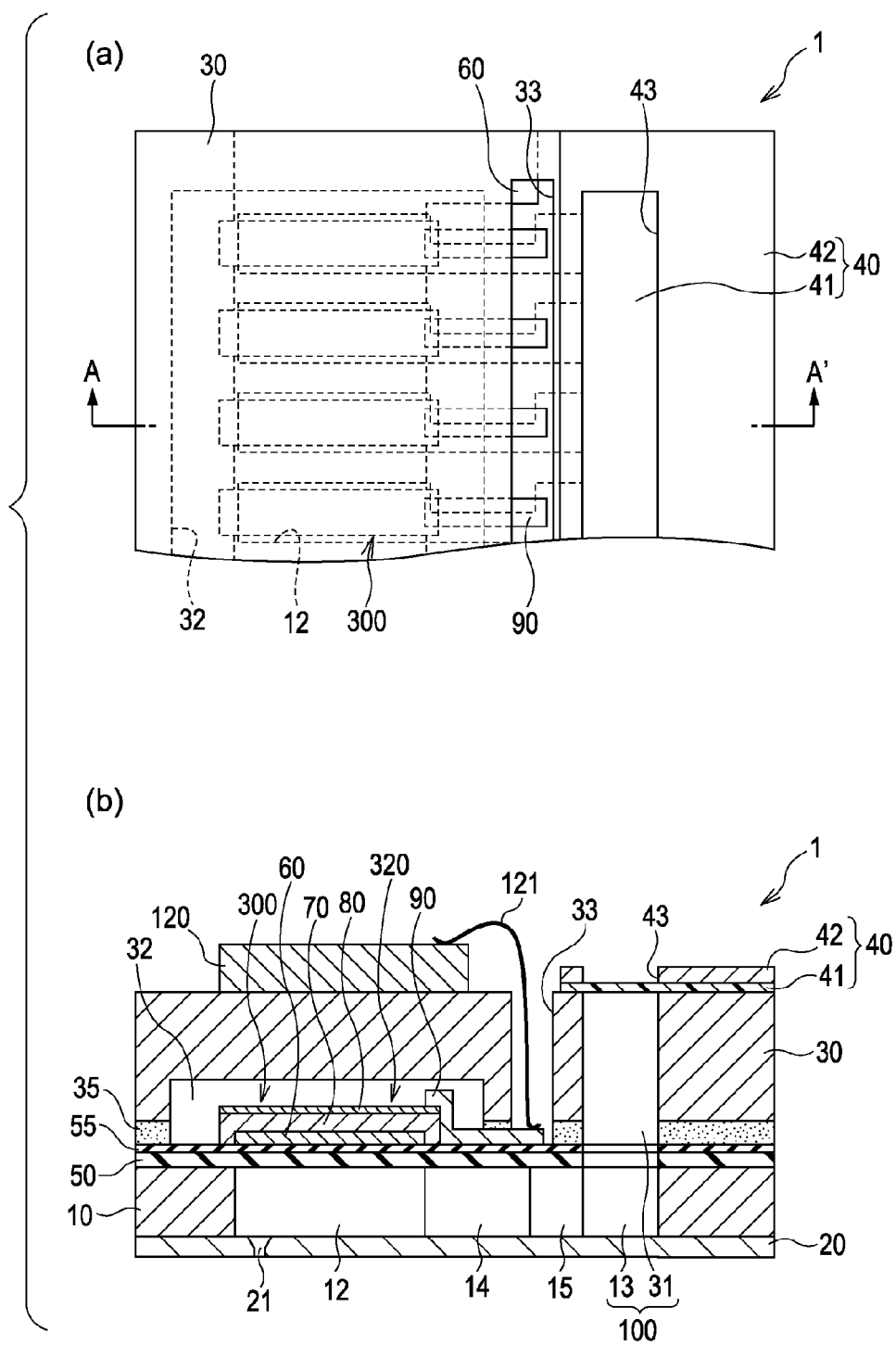
FIG. 2 includes a plan view and a cross-sectional view of the recording head according to Embodiment 1 of the invention.

FIG. 1 is an exploded perspective view showing a schematic structure of an ink jet recording head as an example of a liquid jet head according to an embodiment. FIG. 2(a) is a plan view of FIG. 1, and FIG. 2(b) is an A-A' cross-sectional view of FIG. 2(a).

The passage-forming substrate 10 in this embodiment is made of a silicon single crystal substrate with a (110) crystal plane orientation. An elastic film 50 made of silicon dioxide is formed on one surface of the passage-forming substrate 10 by heat oxidation in advance. An insulator film 55 composed of, for example, zirconium oxide ($ZrO_2$) is formed on the elastic film 50.

Furthermore, pressure-generating chambers 12 separated by a plurality of walls 11 are formed by anisotropically etching the passage-forming substrate 10 from the other surface side so as to be aligned in the width direction (lateral direction) thereof. A communication portion 13 is provided in the outside region in the longitudinal direction of the pressure-generating chambers 12 in each row and is communicated with each of the pressure-generating chambers 12 via an ink supply passage 14 and a communication passage 15 that are provided in each pressure-generating chamber 12. That is, the passage-forming substrate 10 is provided with a liquid flow passage composed of the pressure-generating chambers 12, the communication portion 13, the ink supply passages 14, and the communication passages 15. The communication portion 13 is communicated with a reservoir portion 31 of a protection substrate 30 described below to partially constitute a reservoir 100 that is a common ink chamber for each row of the pressure-generating chambers 12.

The open surface side (the other surface side) of the passage-forming substrate 10 is firmly fixed by, for example, an adhesive or a heat-sealing film to a nozzle plate 20 that is provided with nozzle orifices 21 communicating with the vicinity of the end of the corresponding pressure-generating chambers 12 at the opposite side to the ink supply passage 14.

At the same time, as described above, the elastic film 50 is disposed on the passage-forming substrate 10 at the opposite side to the open surface, and the insulator film 55 is disposed on the elastic film 50. Furthermore, a lower electrode film 60, a piezoelectric material layer 70, and an upper electrode film 80 are laminated on the insulator film 55 by film forming and lithographed to constitute piezoelectric elements 300. The piezoelectric element 300 herein refers to a portion including the lower electrode film 60, the piezoelectric material layer 70, and the upper electrode film 80. In general, one of the electrodes of the piezoelectric element 300 is set as a common electrode, and the other electrode and the piezoelectric material layer 70 are patterned so as to constitute each pressure-generating chamber 12. Furthermore, here, a portion constituted of the patterned electrode of the two and the piezoelectric layer 70 and generating piezoelectric strain by applying a voltage between both the electrodes is referred to as a piezoelectric active portion 320. In the embodiment, the lower electrode film 60 is set as a common electrode of the piezoelectric elements 300, and the upper electrode film 80 is set as individual electrodes of the piezoelectric elements 300. However, depending on a driving circuit and wiring, a reversed positioning thereof can be acceptable without causing any problems. Furthermore, here, the piezoelectric element 300 and a vibration plate undergoing displacement by a drive of the piezoelectric element 300 are collectively referred to as an actuator device. Moreover, in the above-described example, the elastic film 50, the insulator film 55, and the lower electrode film 60 serve as the vibration plate, but the vibration plate is not limited thereto. For example, only the lower electrode film 60, without providing the elastic film 50 and the insulator film 55, may serve as the vibration plate. Furthermore, the piezoelectric element 300 itself may be configured to also substantially serve as the vibration plate.

Furthermore, an example of the piezoelectric material layer 70 of the embodiment is a crystal (perovskite-type crystal) film that is formed on the lower electrode film 60 and has a perovskite structure composed of a ferroelectric ceramic material exhibiting an electromechanical transduction function. Preferred examples of the material of the piezoelectric material layer 70 include ferroelectric piezoelectric materials such as lead zirconate titanate (PZT) and those in which metal oxides, such as niobium oxide, nickel oxide, and magnesium oxide, are added to the ferroelectric piezoelectric materials. Specifically, for example, lead titanate ($PbTiO_3$), lead zirconate titanate ($Pb(Zr,Ti)O_3$), lead zirconate ($PbZrO_3$), lead lanthanum titanate ($(Pb,La)TiO_3$), lead lanthanum zirconate titanate ($(Pb,La)(Zr,Ti)O_3$), or lead zirconium titanate magnesium niobate ($Pb(Zr,Ti)(Mg,Nb)O_3$) can be used. In this embodiment, lead zirconate titanate (PZT) was used as the piezoelectric material layer 7. The thickness of the piezoelectric material layer 70 is regulated to be thin not to cause cracking during the manufacturing process and to be thick to exhibit sufficient displacement characteristics. For example, in the embodiment, the piezoelectric material layer 70 having a thickness of 5 μm or less was formed.

Figure 3:
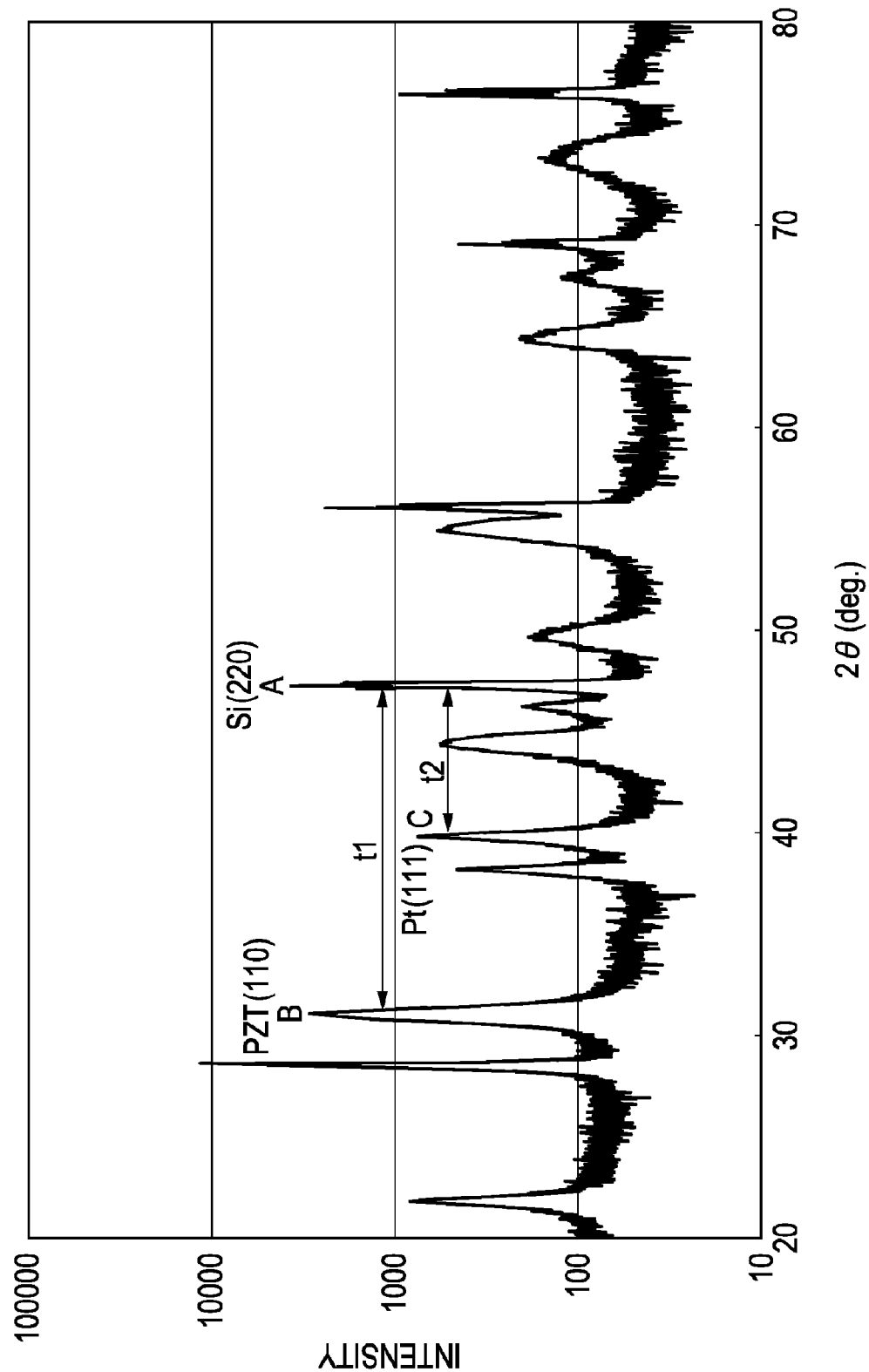
FIG. 3 is a graph showing the measurement results according to Embodiment 1 of the invention.

In addition, as shown in FIG. 3, the piezoelectric material layer 70 is configured such that the distance t1 between an X-ray diffraction peak position A derived from the (220) plane of the passage-forming substrate 10 and an X-ray diffraction peak position B derived from the (110) plane of the piezoelectric material layer 70 is within a range of 2θ=16.262±0.1 degrees, when they are measured by a wide-angle X-ray diffraction (XRD) method.

By setting the X-ray diffraction peak position B of the (110) plane of the piezoelectric material layer 70 to have a predetermined relationship with the X-ray diffraction peak position A of the (220) plane of the passage-forming substrate 10, a large magnitude of displacement can be obtained by a low driving voltage, that is, excellent displacement characteristics can be achieved, and piezoelectric characteristics, such as durability of the piezoelectric material layer, delamination, and partial fixation of the polarization direction with time by repeating rotation and extension/retraction of polarization during the drive, that is, a decrease in the magnitude of displacement due to the so-called fatigue phenomenon, can be improved.

In addition, the half-value width of the X-ray diffraction peak derived from the (110) plane of the piezoelectric material layer 70 of the embodiment is 0.3 degrees or less, when it is measured by a wide-angle X-ray diffraction (XRD) method. Here, in the measurement of the diffraction intensity of the piezoelectric material layer 70 by the wide-angle X-ray diffraction method, peaks corresponding to the (100) plane, (110) plane, (111) plane, and so on occur. The term "half-value width" means the width at the half value of a peak intensity corresponding to each crystal plane in a rocking curve shown by the X-ray diffraction chart (FIG. 3) measured by the wide-angle X-ray diffraction method.

Furthermore, the half-value width of the (110) plane shows dislocation in the crystal lattice in the thickness direction of the piezoelectric material layer 70. Since the piezoelectric characteristics of the piezoelectric material layer 70 are more excellent when the crystal lattice sizes along the thickness direction of the piezoelectric material layer 70 are equal, it is preferable to minimize the half-value width of the (110) plane, which shows the dislocation in the size of crystal lattice of the piezoelectric material layer 70.

Thus, excellent piezoelectric characteristics can be obtained by regulating the half-value width of the (110) plane of the piezoelectric material layer 70 to 0.3 degrees or less for reducing variation in composition ratio, i.e., variation in the crystal lattice, in the thickness direction of the piezoelectric material layer 70.

In addition, the lower electrode film 60 of this embodiment is formed of a material whose main component is platinum (Pt) and, as shown in FIG. 3, is configured such that the distance t2 between the X-ray diffraction peak position C derived from the (111) plane of the lower electrode film 60 and the X-ray diffraction peak position A derived from the (220) plane of the passage-forming substrate is within a range of $2\theta=7.411\pm0.1$ degrees, when they are measured by the wide-angle X-ray diffraction method.

By thus controlling the diffraction peak position C of the (111) plane of the lower electrode film 60 within a predetermined range, the stress of the lower electrode film 60 can be regulated. Therefore, the piezoelectric material layer 70 can be formed on the lower electrode film 60 so as to have the $2\theta$ of the diffraction peak position and the half-value width of the (100) plane within the above-mentioned ranges. That is, since the stress of the lower electrode film 60 affects the crystallinity of the piezoelectric material layer 70 formed thereon, the piezoelectric material layer 70 having crystallinity excellent in piezoelectric characteristics can be formed by controlling the stress of the lower electrode film 60 within a predetermined range.

Furthermore, the piezoelectric material layer 70 can be formed by a sol gel method, an MOD (metal-organic decomposition) method, a sputtering method, or a PVD (physical vapor deposition) method such as a laser ablation method. Then, the piezoelectric material layer 70 having the above-described crystallinity can be formed by regulating, for example, the composition of the sol during the manufacturing or the heat treatment temperature.

In addition, the piezoelectric material layer 70 may be preferentially oriented in any of the (100) plane, the (110) plane, and the (111) plane, and the crystalline structure thereof may be any of a rhombohedral system, a tetragonal system, and a monoclinic system. As shown in FIG. 3, the piezoelectric material layer 70 of the embodiment is preferentially oriented in the (100) plane. Such a piezoelectric material layer 70 preferentially oriented in the (100) plane can obtain a large magnitude of displacement by a low driving voltage, i.e., can be excellent in the so-called displacement characteristics. Therefore, the piezoelectric material layer 70 can be preferably applied to an ink jet recording head 1. Furthermore, the piezoelectric material layer 70 preferentially oriented in the (110) plane can be also used. Incidentally, the piezoelectric material layer 70 preferentially oriented in the (100) plane or the (110) plane can be formed by controlling, for example, the heat treatment temperature during the formation of the piezoelectric material layer 70 by providing an orientation control layer having a predetermined crystal orientation under or on the lower electrode film 60 or providing titanium for neutralizing the orientation of the lower electrode film 60 on the lower electrode film 60.

EXAMPLES 1 to 3

Before the formation of the piezoelectric material layer 70, a lower electrode film 60 was formed as a base by sequentially laminating an adhesion layer made of titanium (Ti) on the passage-forming substrate, a platinum layer made of platinum (Pt) on the adhesion layer, an iridium layer made of iridium (Ir) on the platinum layer, and a seed crystal layer made of titanium (Ti) on the iridium layer. Then, the piezoelectric material layer 70 was formed on this lower electrode film 60 by a sol gel method. Specifically, the piezoelectric material layer 70 was formed by applying a sol (application solution) containing an organic material, as a raw material of the piezoelectric material layer 70, to the lower electrode film 60 side surface of the passage-forming substrate 10. In Examples 1 to 3, the sol (application solution) was applied by spin coating, and the thickness of the film formed of the sol was stabilized by spinning for 30 to 60 seconds after completion of the application. Subsequently, the applied application solution was heated to a predetermined temperature for drying for a certain period of time to form a piezoelectric precursor film. In Examples 1 to 3, the drying was performed by heating at $100\pm10°$ C. for 3 minutes as a first step and then at $160\pm10°$ C. for 3 minutes as a second step. Then, the dried piezoelectric precursor film is heated to a predetermined temperature and is maintained at the temperature for a certain period of time for degreasing (degreasing step). In the embodiment, the dried piezoelectric precursor film was heated at $450\pm15°$ C. for 3 minutes for degreasing. The term "degrease" used herein means that organic components contained in the piezoelectric precursor film are released as, for example, $NO_2$, $CO_2$, and $H_2O$ without causing crystallization of the piezoelectric precursor film, that is, it means to form an amorphous piezoelectric precursor film. Then, the degreased piezoelectric precursor film is heated to a predetermined temperature and maintained at the temperature for a certain period of time for crystallization to form a piezoelectric material layer 70 (burning step). In the embodiment, the degreased piezoelectric precursor film was heated at $737\pm30°$ C. for 5 minutes for burning the piezoelectric precursor film to form a piezoelectric material layer 70. Three piezoelectric material layers 70 were produced under the same manufacturing conditions and were used as those in Examples 1 to 3. Furthermore, an upper electrode film 80 was formed on each of the piezoelectric material layer 70 of Examples 1 to 3, and pressure-generating chambers 12 and other components were formed in the passage-forming substrate 10.

COMPARATIVE EXAMPLES 1 and 2

Two piezoelectric material layers were produced under manufacturing conditions that were at least partially different from those in the above-described Examples 1 to 3 and were used as those in Comparative Examples 1 and 2.

TEST EXAMPLE 1

The piezoelectric material layers of Examples 1 to 3 and Comparative Examples 1 and 2 were subjected to a wide-angle X-ray diffraction (XRD) method. The wide-angle X-ray diffraction method in the embodiment was performed with an X-ray diffraction analyzer (GXR300, manufactured by Rigaku Corp.) using a Cu—Kα light source under conditions of a main wavelength of 1.541838 Å, a scanning rate of 2 degrees/min, and a pitch θ (resolution) during the scanning of 0.02 degrees. The results are shown in the following Table 1.

Furthermore, the magnitude of displacement at the beginning of the drive (initial displacement) and the magnitude of displacement after repeating the drive (decreased magnitude of displacement) were measured for the piezoelectric elements of Examples 1 to 3 and Comparative Examples 1 and 2 to comparatively determine the magnitude of the initial displacement and the decreased magnitude of displacement. The results are shown in the following Table 1.

TABLE 1

| | t1 (110)-(220) | Initial displacement | Decrease in displacement (fatigue) | Determination |
|---|---|---|---|---|
| Comparative Example 1 | 16.14 | Δ | ◯ | Δ |
| Example 1 | 16.162 | ◯ | ◯ | ◯ |
| Example 2 | 16.262 | ◯ | ◯ | ◯ |
| Example 3 | 16.362 | ◯ | ◯ | ◯ |
| Comparative Example 2 | 16.371 | ◯ | Δ | Δ |

As shown in Table 1, in Examples 1 to 3 wherein each distance t1 between the X-ray diffraction peak position A derived from the (220) plane of the passage-forming substrate 10 and the X-ray diffraction peak position B derived from the (110) plane of the piezoelectric material layer 70 was 2θ=16.262±0.1 degrees, it was proved that the magnitude of displacement in the beginning of the drive was excellent and the decrease (fatigue) in the displacement due to repeating of the drive was small. On the other hand, in Comparative Example 1 wherein the distance t1 was smaller than 2θ=16.162 degrees, the magnitude of the initial displacement was small, and in Comparative Example 2 wherein the distance t1 was larger than 2θ=16.362 degrees, the decreased magnitude of displacement was large.

Therefore, as described above, the piezoelectric element 300 including a piezoelectric material layer 70 having the distance t1 between an X-ray diffraction peak position A derived from the (220) plane of the passage-forming substrate 10 and an X-ray diffraction peak position B derived from the (110) plane of the piezoelectric material layer 70 within a range of 2θ=16.262±0.1 degrees is excellent in the initial displacement and low in the decreased magnitude of displacement.

In addition, each upper electrode film 80 as an individual electrode of each piezoelectric element 300 is connected with a lead electrode 90 made of, for example, gold (Au) that is extracted from near the end on the ink supply passage 14 side and extends onto the insulator film 55.

Above the passage-forming substrate 10 provided with such piezoelectric elements 300, i.e., above the lower electrode film 60, the insulator film 55, and the lead electrode 90, a protection substrate 30 having a reservoir portion 31 at least partially constituting the reservoir 100 is bonded via an adhesive 35. The reservoir portion 31 in the embodiment is formed over the width direction of the pressure-generating chambers 12 so as to pass through the protection substrate 30 in the thickness direction and is, as described above, communicated with the communication portion 13 of the passage-forming substrate 10 to constitute the reservoir 100 that serves as a common ink chamber of each of the pressure-generating chambers 12. In addition, the communication portion 13 of the passage-forming substrate 10 may be segmented for each of the pressure-generating chambers 12 so that only the reservoir portion 31 serves as the reservoir. Furthermore, for example, the passage-forming substrate 10 may be provided with only the pressure-generating chambers 12, and a member (for example, the elastic film 50 or the insulator film 55) interposed between the passage-forming substrate 10 and the protection substrate 30 may be provided with the ink supply passage 14 for connecting the reservoir to each pressure-generating chamber 12.

The protection substrate 30 is provided with piezoelectric element-holding portions 32 each having a space in the region facing the piezoelectric element 300 so that the movement of the piezoelectric element 300 is not disturbed. The space of the piezoelectric element-holding portion 32 may be sealed or not sealed as long as the movement of the piezoelectric element 300 is not disturbed.

In addition, the protection substrate 30 is provided with a through-hole 33 passing through the protection substrate 30 in the thickness direction, and the vicinity of the end of the lead electrode 90 extracted from each of the piezoelectric elements 300 is exposed in the through-hole 33.

Furthermore, driving circuits 120 that function as signal-processing portions are fixed on the protection substrate 30. The driving circuit 120 may be, for example, a circuit board or a semiconductor integrated circuit (IC). The driving circuit 120 and the lead electrode 90 are electrically connected to each other with connection wiring 121 that is composed of electrically conductive wire such as bonding wire and is inserted through the through-hole 33.

The protection substrate 30 is preferably made of a material, for example, a glass or ceramic material, having approximately the same thermal expansion coefficient as that of the passage-forming substrate 10. In the embodiment, the protection substrate 30 was formed of a silicon single crystal substrate having the same surface orientation (110) as that of the material of the passage-forming substrate 10.

Furthermore, a compliance substrate 40 composed of a sealing film 41 and a fixing plate 42 is bonded on the protection substrate 30. Here, the sealing film 41 is made of a material having low rigidity and high flexibility, such as a polyphenylene sulfide (PPS) film, and seals one side of the reservoir portion 31. The fixing plate 42 is made of a hard material, for example, a metal such as stainless steel (SUS) and has, at a region facing the reservoir 100, an opening portion 43 formed by removing the fixing plate 42 in the region completely in the thickness direction. Therefore, one side of the reservoir 100 is sealed by only the sealing film 41 having flexibility.

In such an ink jet recording head 1 of the embodiment, ink is supplied from an ink supply port that is connected to external ink-supplying means (not shown in the drawings) to fill the entire inside from the reservoir 100 to the nozzle orifice 21 with ink. Then, according to a recording signal from the driving circuit 120, a voltage is applied between the lower electrode film 60 and the upper electrode film 80 that correspond to the pressure-generating chamber 12 to flexurally deform the elastic film 50, the insulator film 55, the lower electrode film 60, and the piezoelectric material layer 70. This increases the pressure in each pressure-generating chamber 12 to eject an ink droplet from the nozzle orifice 21.

Thus, in the embodiment, since the piezoelectric elements 300 including the piezoelectric material layers 70 having excellent displacement characteristics are applied to an ink jet recording head 1, the ink jet recording head 1 is improved in the ink ejection characteristics such as the ink ejecting rate at a low driving voltage and the weight of an ink droplet.

Other Embodiment

In the above, an embodiment of the invention has been described, but the basic structure of the invention is not limited thereto. For example, in the above-described embodiment 1, a material whose main component is platinum (Pt) is exemplarily shown as the material of the lower electrode film 60, but the lower electrode film 60 is not particularly limited thereto and may be, for example, provided with an adhesion layer made of a material other than platinum on the undermost layer on the insulator film 55 side of the lower electrode film 60 for increasing the adhesiveness. In addition, the lower electrode film 60 may be provided with a diffusion preventing layer for preventing the component of the lower electrode film 60 from diffusing to the piezoelectric material layer 70 and also preventing the component of the piezoelectric material layer 70 from diffusing to the lower electrode film 60. Examples of material of the adhesion layer include titanium (Ti) zirconium (Zr), tantalum (Ta), tungsten (W), nickel (Ni) hafnium (Hf), niobium (Nb), molybdenum (Mo), and cobalt (Co). Examples of material of the diffusion preventing layer include iridium (Ir), palladium (Pb), rhodium (Rh) ruthenium (Ru), osmium (Os), and oxides thereof.

Furthermore, in the above-described embodiment 1, the ink jet recording head has been described as an example of the liquid jet head, but the invention is intended to include general liquid jet heads and can be surely applied to liquid jet heads for jetting liquids other than ink. Examples of the other liquid jet heads include various types of recording heads used in image recording apparatuses such as a printer, color-material jet heads used for producing color filters for a liquid crystal display and so on, electrode-material jet heads used for forming electrodes for an organic EL display, an FED (field emission display) and so on, and bio-organic-material jet heads used for producing biochips.

Furthermore, the invention is not limited to the piezoelectric elements that are mounted on liquid jet heads represented by ink jet recording heads and can be applied to piezoelectric elements that are mounted on other apparatuses.

The invention claimed is:

1. A liquid jet head comprising:
a passage-forming substrate composed of a crystal substrate provided with pressure-generating chambers communicating with nozzle orifices and piezoelectric elements disposed on the passage-forming substrate and each composed of a lower electrode, a piezoelectric material layer, and an upper electrode to cause a change of pressure in the pressure-generating chamber, wherein
the piezoelectric material layer has a thickness of 5 μm or less and is made of a perovskite-type crystal and is configured such that the distance between an X-ray diffraction peak position derived from the (220) plane of the passage-forming substrate and an X-ray diffraction peak position derived from the (110) plane of the piezoelectric material layer is within a range of $2\theta=16.262\pm0.1$ degrees.

2. The liquid jet head according to claim 1, wherein
the half-value width of the X-ray diffraction peak derived from the (110) plane of the piezoelectric material layer is 0.3 degrees or less.

3. The liquid jet head according to claim 1, wherein
the lower electrode is made of a material whose main component is platinum and is configured such that the distance between an X-ray diffraction peak position derived from the (111) plane of the lower electrode and the X-ray diffraction peak position derived from the (220) plane of the passage-forming substrate is within a range of $2\theta=7.411\pm0.1$ degrees.

4. A piezoelectric element comprising:
a lower electrode disposed on a crystal substrate, a piezoelectric material layer having a thickness of 5 μm or less and made of a perovskite-type crystal, and an upper electrode, wherein
the piezoelectric material layer is configured such that the distance between an X-ray diffraction peak position derived from the (220) plane of the crystal substrate and an X-ray diffraction peak position derived from the (110) plane of the piezoelectric material layer is within a range of $2\theta=16.262\pm0.1$ degrees.

\* \* \* \* \*